United States Patent
Ellis-Monaghan et al.

(10) Patent No.: US 11,374,040 B1
(45) Date of Patent: Jun. 28, 2022

(54) PIXEL ARRAYS INCLUDING HETEROGENOUS PHOTODIODE TYPES

(71) Applicant: GLOBALFOUNDRIES U.S. Inc., Santa Clara, CA (US)

(72) Inventors: John J. Ellis-Monaghan, Grand Isle, VT (US); Steven M. Shank, Jericho, VT (US); Rajendran Krishnasamy, Essex Junction, VT (US); Ramsey Hazbun, Colchester, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/113,418

(22) Filed: Dec. 7, 2020

(51) Int. Cl.
*H01L 27/144* (2006.01)
*H01L 31/028* (2006.01)
*H01L 31/18* (2006.01)
*H01L 31/103* (2006.01)
*H01L 31/0312* (2006.01)

(52) U.S. Cl.
CPC ........ *H01L 27/1443* (2013.01); *H01L 31/028* (2013.01); *H01L 31/0312* (2013.01); *H01L 31/103* (2013.01); *H01L 31/1808* (2013.01); *H01L 31/1812* (2013.01)

(58) Field of Classification Search
CPC ............... H01L 27/1443; H01L 31/028; H01L 31/0312; H01L 31/103; H01L 31/1808; H01L 31/1812
See application file for complete search history.

(56) References Cited

U.S. PATENT DOCUMENTS

| | | | |
|---|---|---|---|
| 5,965,875 A | 10/1999 | Merrill | |
| 6,107,618 A | 8/2000 | Fossum et al. | |
| 6,885,002 B1* | 4/2005 | Finch | H04N 5/33 250/330 |
| 7,095,027 B1 | 8/2006 | Boreman et al. | |
| 10,256,264 B2 | 4/2019 | Na et al. | |
| 2005/0133723 A1* | 6/2005 | Lee | H01L 21/02381 250/338.4 |
| 2005/0263805 A1* | 12/2005 | Mouli | H01L 27/14625 257/292 |
| 2007/0023661 A1 | 2/2007 | Wagner et al. | |
| 2009/0200589 A1 | 8/2009 | Qian et al. | |
| 2013/0011955 A1* | 1/2013 | Kawabata | H01L 27/14603 438/69 |
| 2014/0312386 A1* | 10/2014 | Huang | H01L 21/02532 257/184 |

(Continued)

OTHER PUBLICATIONS

John J. Ellis-Monaghan et al., "Trench-Based Photodiodes" filed Dec. 13, 2019 as U.S. Appl. No. 16/713,423.

*Primary Examiner* — Sitaramarao S Yechuri
(74) *Attorney, Agent, or Firm* — Thompson Hine LLP; Francois Pagette

(57) ABSTRACT

Structures including multiple photodiodes and methods of fabricating a structure including multiple photodiodes. A substrate has a first trench extending to a first depth into the substrate and a second trench extending to a second depth into the substrate that is greater than the first depth. A first photodiode includes a first light-absorbing layer containing a first material positioned in the first trench. A second photodiode includes a second light-absorbing layer containing a second material positioned in the second trench. The first material and the second material each include germanium.

20 Claims, 4 Drawing Sheets

(56) References Cited

U.S. PATENT DOCUMENTS

2015/0129747 A1\* 5/2015 Petilli ............... H01L 27/14627
250/208.1
2015/0381907 A1 12/2015 Boettiger et al.
2020/0058697 A1\* 2/2020 Meylan ............... H01L 27/1465

\* cited by examiner

PIXEL ARRAYS INCLUDING HETEROGENOUS PHOTODIODE TYPES

BACKGROUND

The present invention relates to photonics chips and, more particularly, to structures including multiple photodiodes and methods of fabricating a structure including multiple photodiodes.

Infrared wavelength motion detection systems, such as Light Detection and Ranging (LIDAR) systems, may use a germanium photodiode as a sensor. A photodiode converts impinging electromagnetic radiation by the photoelectric effect into free charge carriers as photons are absorbed and electron-hole pairs are generated. Germanium exhibits high photon absorption in the infrared wavelength range and in the visible wavelength range. Conversely, silicon photodiodes exhibit high photon absorption in the visible wavelength range but poor photon absorption in the infrared wavelength range.

The ability of a photodiode to generate free charge carriers depends, among other factors, on the bandgap of the light-absorbing material from which the photodiode is constructed. The bandgap is the distance between the valence band of electrons and the conduction band in the electronic band structure of a material. Essentially, the bandgap represents the minimum energy that is required to excite an electron from the valence band to a state in the conduction band. In general, a material having a lower energy bandgap has a higher absorption coefficient at a particular wavelength. Silicon is an inefficient photodiode material for infrared wavelengths due to its large bandgap. Conversely, germanium is an efficient photodiode material for both visible and infrared wavelengths due its high absorption coefficient.

Improved structures including multiple photodiodes and methods of fabricating a structure including multiple photodiodes are needed.

SUMMARY

In an embodiment of the invention, a structure includes a substrate having a first trench extending to a first depth into the substrate and a second trench extending to a second depth into the substrate that is greater than the first depth. A first photodiode includes a first light-absorbing layer comprised of a first material positioned in the first trench. A second photodiode includes a second light-absorbing layer comprised of a second material positioned in the second trench. The first material and the second material each comprise germanium.

In an embodiment of the invention, a method includes forming a first trench extending to a first depth into a substrate and a second trench extending to a second depth into the substrate that is greater than the first depth, forming a first photodiode including a first light-absorbing layer comprised of a first material positioned in the first trench, and forming a second photodiode including a second light-absorbing layer comprised of a second material positioned in the second trench. The first material and the second material each comprise germanium.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
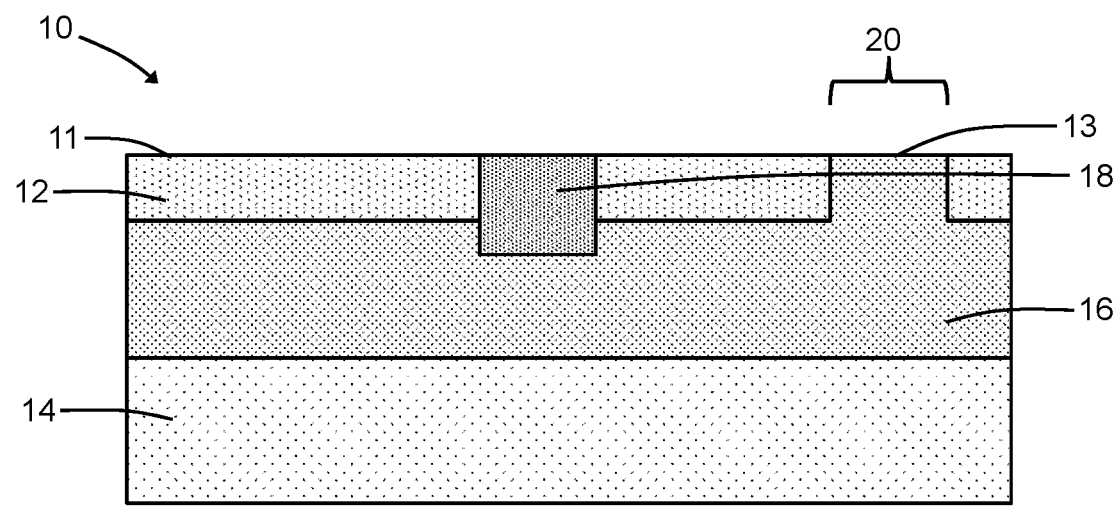
FIGS. 1-5 are cross-sectional views of a structure at successive fabrication stages of a processing method in accordance with embodiments of the invention.

With reference to FIG. 1 and in accordance with embodiments of the invention, a structure 10 includes shallow trench isolation regions 12 that are formed in a well 16 defined in an upper portion of a substrate 14. The well 16 may be formed by, for example, ion implantation and may be lightly doped to have p-type conductivity. The substrate 14 may be comprised of a single-crystal semiconductor material, such as single-crystal silicon. The shallow trench isolation regions 12 may be formed by patterning trenches in the substrate 14 with lithography and etching processes, depositing a dielectric material, such as silicon dioxide, in the trenches, and polishing the deposited dielectric material with chemical mechanical polishing. The shallow trench isolation regions 12 may have a top surface 11 that is coplanar or substantially coplanar with a top surface 13 of the substrate 14.

The shallow trench isolation regions 12 surround portions of the substrate 14. A doped region 18 may be formed in one of these portions of the substrate 14, and the other of these portions of the substrate 14 may define a body contact 20 providing access to contact the well 16. The doped region 18 and body contact 20 may intersect the top surface 13 of the substrate 14. The doped region 18 may extend to a greater depth into the substrate 14 than the shallow trench isolation regions 12. The doped region 18 may have an opposite conductivity type from the well 16. In an embodiment, the semiconductor material of the doped region 18 may be doped with an n-type dopant (e.g., phosphorus and/or arsenic) that provides n-type conductivity after activation.

The doped region 18 may be formed by, for example, ion implantation with an implantation mask including an opening over the intended location for the doped region 18. The implantation mask may include a layer of photoresist applied by a spin-coating process, pre-baked, exposed to light projected through a photomask, baked after exposure, and developed with a chemical developer. The implantation conditions (e.g., ion species, ion dose, kinetic energy) may be selected to tune the characteristics of the doped region 18. The implantation mask may be stripped after forming the doped region 18.

Figure 2:
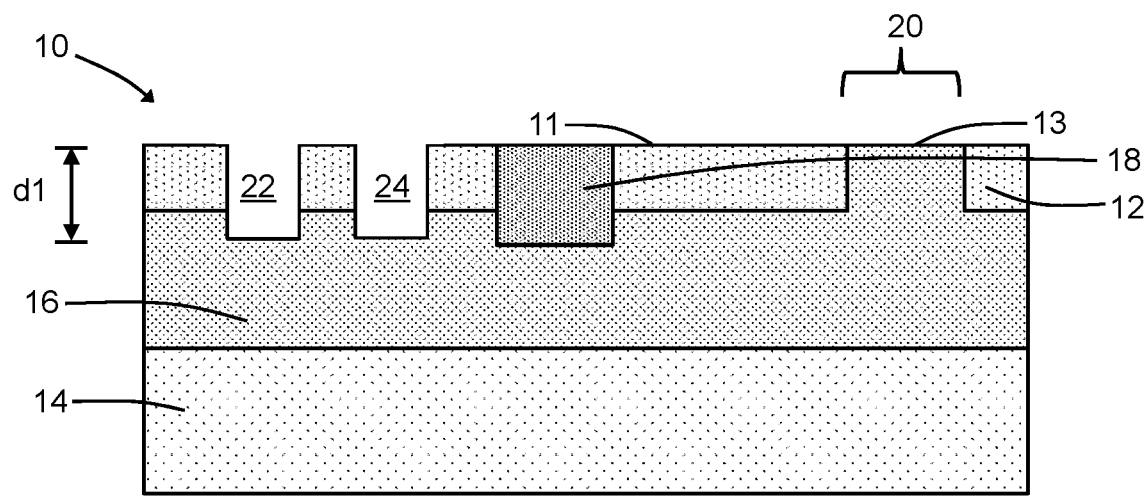

With reference to FIG. 2 in which like reference numerals refer to like features in FIG. 1 and at a subsequent fabrication stage, trenches 22, 24 are formed that extend fully through one or more of the shallow trench isolation regions 12 and to a shallow depth into the well 16 in the substrate 14 beneath the one or more shallow trench isolation regions 12. The trench 22 is laterally spaced from the trench 24. The trenches 22, 24 may be patterned by photolithography and etching processes, and the trenches 22, 24 may extend to a depth, d1, relative to the top surface 13 of the substrate 14. In that regard, an etch mask may be formed that includes a layer of a light-sensitive material, such as a photoresist, applied by a spin-coating process, pre-baked, exposed to light projected through a photomask, baked after exposure, and developed with a chemical developer to define openings at the intended locations for the trenches 22, 24, and then an etching process may be used to form the trenches 22, 24.

Figure 3:
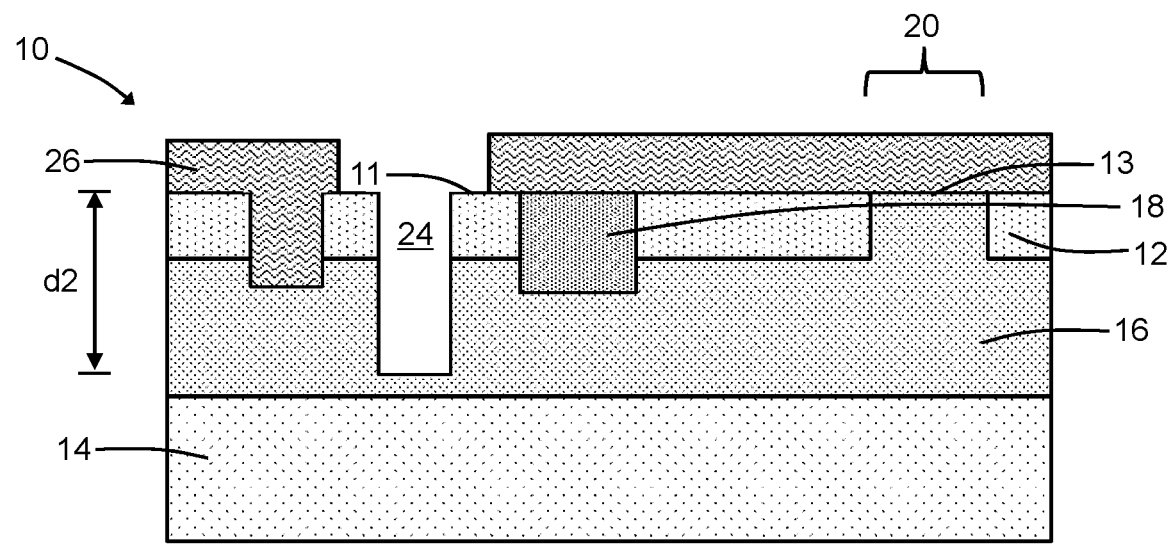

With reference to FIG. 3 in which like reference numerals refer to like features in FIG. 2 and at a subsequent fabrication stage, the trench 24 is deepened to a greater depth than the trench 22. The trench 24 may be deepened by photolithography and etching processes to a depth, d2, relative to the top surface 13 of the substrate 14 without increasing the depth of the trench 22 and without any modification to the doped region 18. In that regard, an etch mask 26 may be formed that includes a layer of a light-sensitive material, such as a photoresist, applied by a spin-coating process, pre-baked, exposed to light projected through a photomask, baked after exposure, and developed with a chemical developer to define an opening at the location of the trench 24, and then an etching process may be used to etch the substrate 14 and thereby increase the depth of the trench 24. The etch mask 26 fills the trench 22 and covers the doped region 18 and body contact 20 during the etching process. The etch mask 26 is stripped after the trench 24 is deepened.

Figure 4:
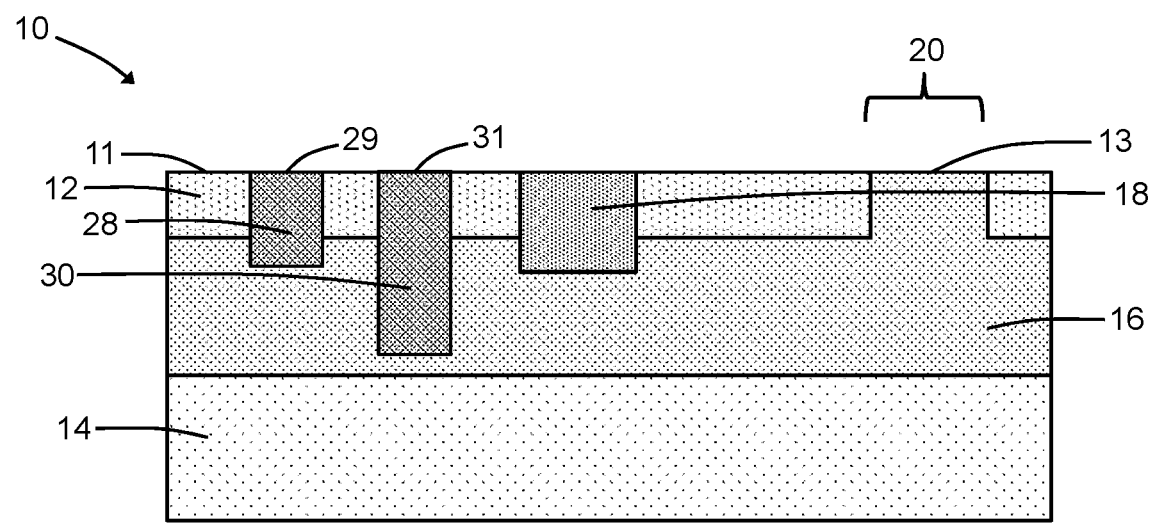

With reference to FIG. 4 in which like reference numerals refer to like features in FIG. 3 and at a subsequent fabrication stage, a light-absorbing layer 28 is formed in the trench 22, and a light-absorbing layer 30 is formed in the trench 24. The light-absorbing layers 28, 30 may be comprised of a single-crystal semiconductor material that is epitaxially grown inside the trenches 22, 24 from the surfaces of the substrate 14 that surround the lower portion of each of the trenches 22, 24. In an embodiment, the light-absorbing layers 28, 30 may be concurrently formed. In an embodiment, the light-absorbing layers 28, 30 may be separately formed, which may enable their formation from different materials. In an embodiment, the depth of the trench 24 may be greater than or equal to four (4) microns, which may extend the sensitivity of a photodiode formed using the light-absorbing layer 30 beyond the near infrared range (approximately 1.4 microns).

In an embodiment, the light-absorbing layers 28, 30 may contain the same material. In an embodiment, the light-absorbing layers 28, 30 may contain different materials. In an embodiment, the light-absorbing layer 28 and/or the light-absorbing layer 30 may be comprised of germanium. In an embodiment, the light-absorbing layer 28 and/or the light-absorbing layer 30 may be comprised of an alloy containing silicon and germanium (i.e., a silicon-germanium alloy). In an embodiment, the material of the light-absorbing layer 28 and the material of the light-absorbing layer 30 are germanium. In an embodiment, the light-absorbing layer 28 and/or the light-absorbing layer 30 may be comprised of an alloy containing germanium and tin (i.e., a germanium-tin alloy), which may extend the sensitivity of a photodiode formed using the light-absorbing layer 28 and/or a photodiode formed using the light-absorbing layer 30 to a wavelength in a range of two (2) microns to three (3) microns.

The light-absorbing layers 28, 30 may be formed by a selective epitaxial growth process. The light-absorbing layers 28, 30 may be in situ doped during epitaxial growth with a concentration of a dopant, such as an n-type dopant (e.g., arsenic or phosphorus) that provides n-type conductivity. The light-absorbing layers 28, 30 may have an opposite conductivity type from the well 16. In an alternative embodiment, the light-absorbing layers 28, 30 may be etched back and polished with chemical mechanical polishing, after epitaxial growth, to planarize the top surface 29 of the light-absorbing layer 28 and the top surface 31 of the light-absorbing layer 30.

In an embodiment, both of the light-absorbing layers 28, 30 may be located fully at and below the top surface 11 and/or the top surface 13. In an embodiment, the top surfaces 29, 31 of the light-absorbing layers 28, 30 may be coplanar or substantially coplanar with the top surface 11 of the shallow trench isolation regions 12. In an embodiment, the top surfaces 29, 31 may be coplanar or substantially coplanar with the top surface 13 of the substrate 14. In an embodiment, the top surfaces 29, 31 may be coplanar or substantially coplanar with the top surface 11 of the shallow trench isolation regions 12 and the top surface 13 of the substrate 14. In an embodiment, the top surfaces 29, 31 may not be coplanar with each other and/or coplanar with either the top surface 11 of the shallow trench isolation regions 12 or the top surface 13 of the substrate 14.

Figure 5:
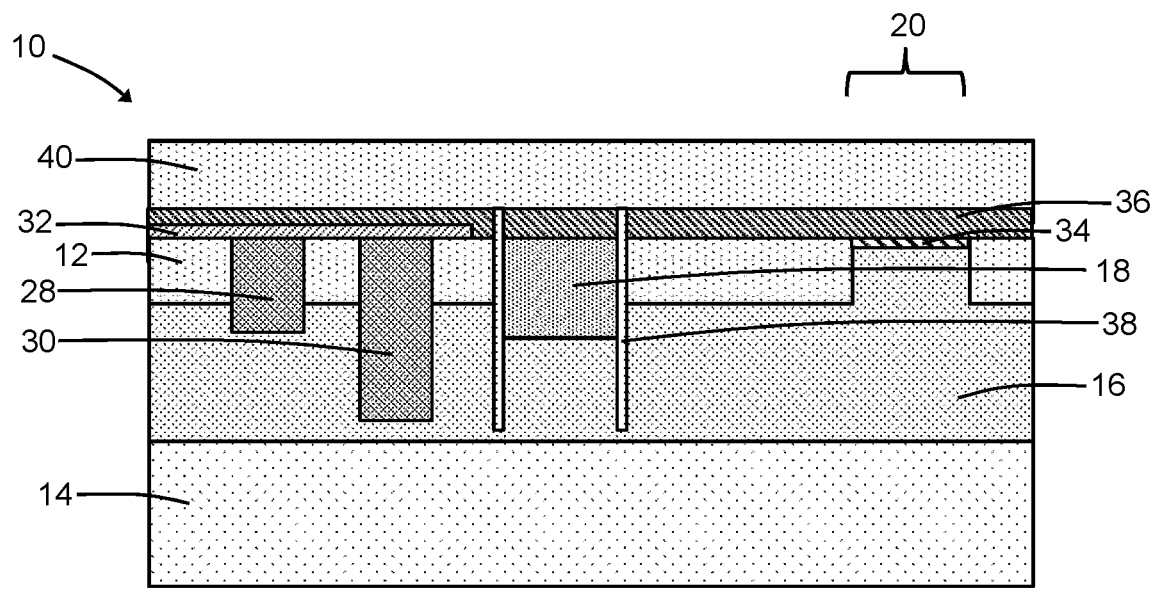

With reference to FIG. 5 in which like reference numerals refer to like features in FIG. 4 and at a subsequent fabrication stage, a layer 32 is formed over the light-absorbing layers 28, 30. In an embodiment, the layer 32 may be in direct physical and electrical contact with the top surfaces 29, 31 of the light-absorbing layers 28, 30. The layer 32 may be comprised of a conductor, such as doped polysilicon, that is deposited and then patterned by lithography and etching processes. In an embodiment, the layer 32 may be comprised of n-type polysilicon. In an embodiment, the layer 32 may be doped to have the same conductivity type as the light-absorbing layers 28, 30.

A silicide layer 34 may be formed by a silicidation process on an upper portion of the body contact 20. A dielectric layer 36, which may be comprised of silicon nitride, is arranged over the structure 10 and may include individual contributions from a silicide-blocking layer and a barrier layer. Deep trench isolation regions 38, which may be comprised of silicon dioxide, may be formed in trenches patterned in the substrate 14 adjacent to the doped region 18. A dielectric layer 40 of a contact level may be formed over the dielectric layer 36. The dielectric layer 40 may be comprised of silicon dioxide, and portions of the dielectric layer 40 may provide the dielectric material for the deep trench isolation regions 38.

Middle-of-line and back-end-of line processing follow to form an interconnect structure that includes metal features that are connected with the body contact 20 and the layer 32. Lenses may be formed over the interconnect structure that focus incident electromagnetic radiation to the light-absorbing layers 28, 30 and the doped region 18.

The doped region 18 provides a light-absorbing layer serving as the detector element of a photodiode that is comprised of silicon. The light-absorbing layer 28 serves as the detector element of a photodiode that is comprised of germanium. The light-absorbing layer 30 also serves as the detector element of a photodiode that is also comprised of germanium, but that is formed in the trench 24 having a greater depth that the trench 22 in which the light-absorbing layer 28 is formed. The photodiodes may possess different sensitivities in different wavelength ranges of the electromagnetic spectrum. The photodiode including the light-absorbing layer 30 may have a longer infrared wavelength sensitivity than the photodiode including the light-absorbing layer 28 and the photodiode including the doped region 18. The photodiode including the doped region 18 may only be sensitive to visible light.

The photodiodes, which have different bandgaps and different absorption lengths, may be located on the same optical detector or imager array and are monolithically integrated in the same substrate 14. For example, at room temperature, the material of the doped region 18 may have an energy bandgap that is greater than the energy bandgap of the material of the light-absorbing layers 28, 30. For example, at room temperature, silicon may have an energy bandgap of 1.12 electron volts (eV), germanium may have an energy bandgap of 0.66 eV, and germanium-tin alloys may have an energy bandgap that is less than the energy bandgap of germanium. Combinations of measured photocurrent from the different photodiodes may permit differentiation between electromagnetic radiation of visible and infrared wavelengths.

Figure 6:
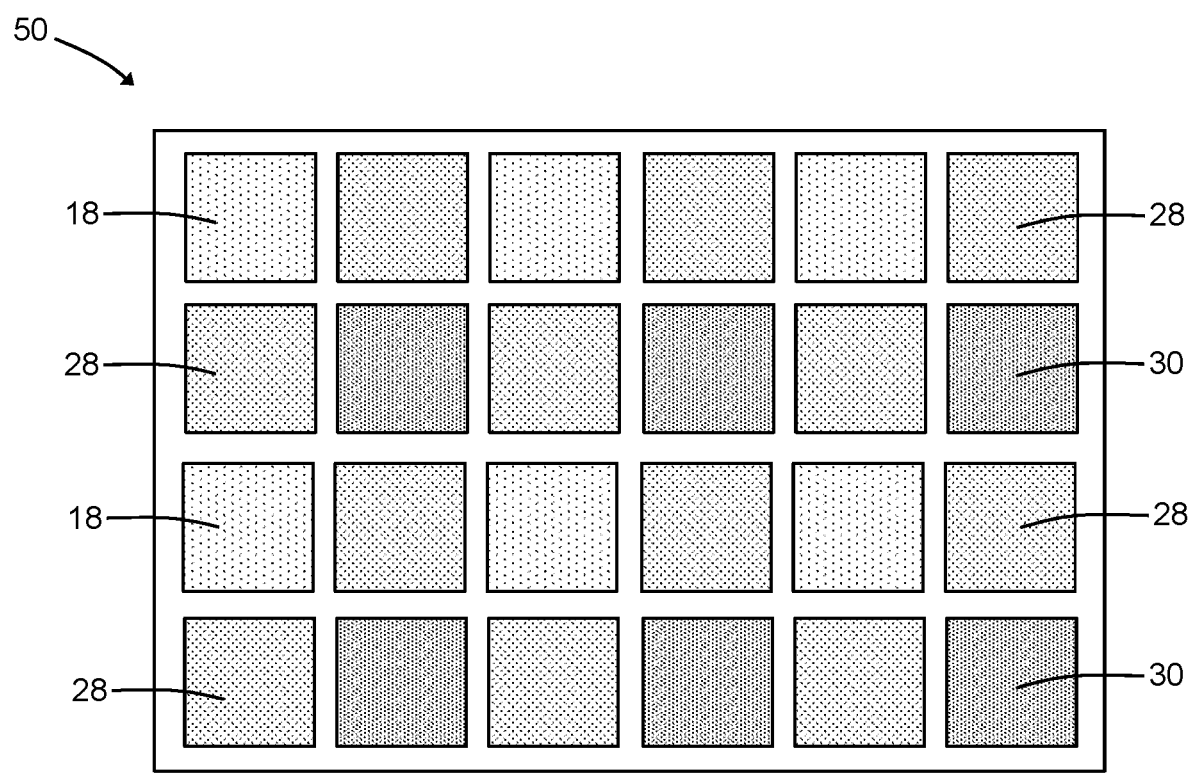
FIG. 6 is a top view of a structure in accordance with alternative embodiments of the invention.

With reference to FIG. 6 and in accordance with embodiments of the invention, the photodiode including the light-absorbing layer 28, the photodiode including the light-absorbing layer 30, and the photodiode including the doped region 18 may be replicated as pixels and placed with positions in a pixel array 50. The photodiodes may be arranged in rows and columns in the pixel array 50 in which different types of photodiodes may alternate row-wise and may also alternate column-wise. The photodiodes in the pixel array may operate without the need for conventional light filters.

In the pixel array 50, the photodiode including the light-absorbing layer 30 may generate a stronger signal for impinging light having a longer wavelength (e.g., 1.5 microns) than the photodiode including the light-absorbing layer 28, and the photodiode including the doped region 18 may generate substantially no signal. In the pixel array 50, the photodiode including the light-absorbing layer 28 may generate a stronger signal for impinging light having a slightly shorter wavelength (e.g., 1.1 microns) than the photodiode including the light-absorbing layer 30, and the photodiode including the doped region 18 may generate substantially no signal. In the pixel array 50, the photodiode including the doped region 18 may generate as strong a signal for impinging light having a visible or near-visible wavelength (e.g., 850 nanometers) as the photodiode including the light-absorbing layer 30 and the photodiode including the light-absorbing layer 28.

Figure 7:
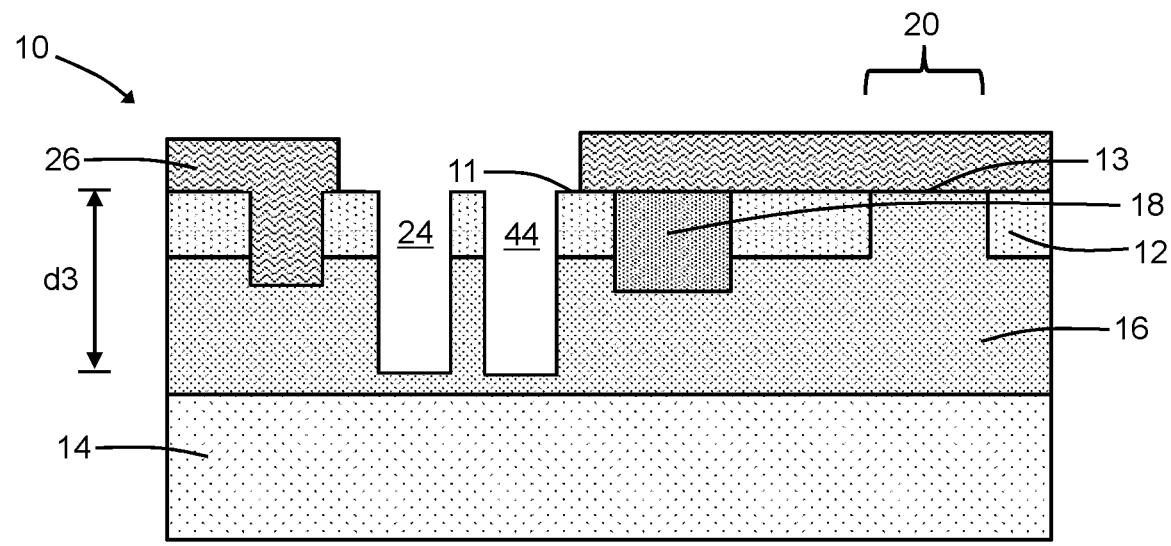
FIGS. 7-8 are cross-sectional views of a structure at successive fabrication stages of a processing method in accordance with embodiments of the invention.

With reference to FIG. 7 and in accordance with embodiments of the invention, the structure 10 may be modified to include a trench 44. In an embodiment, the trench 44 may have a depth, d3, that is equal to the depth of the trench 24. The trench 44 may be concurrently formed in parallel with the trench 24 by the same fabrication stages used to form the trench 24.

Figure 8:
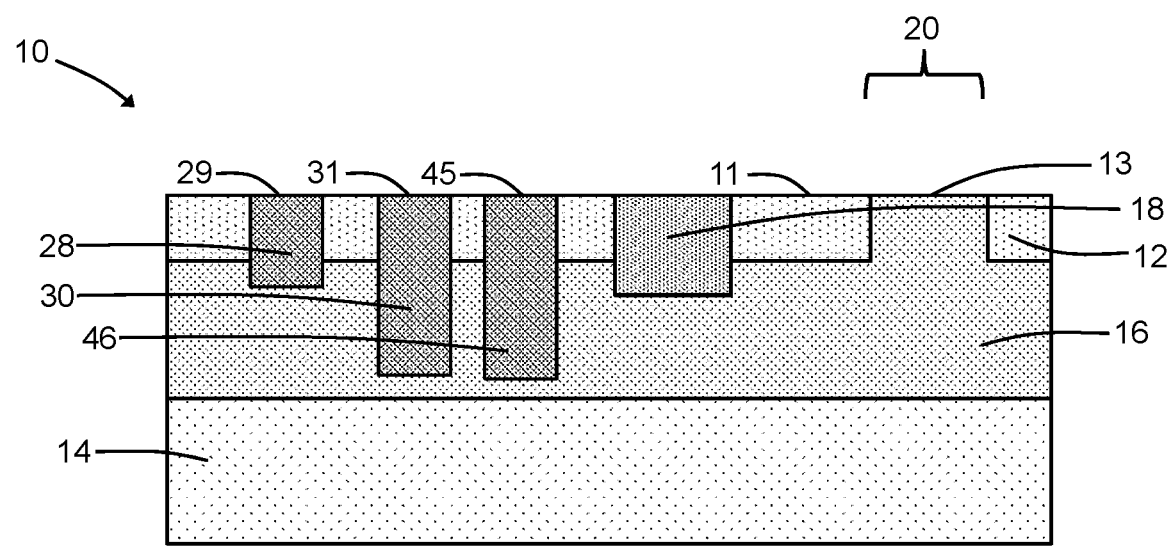

With reference to FIG. 8 in which like reference numerals refer to like features in FIG. 7 and at a subsequent fabrication stage, an additional photodiode is formed that includes a light-absorbing layer 46 that is positioned inside the trench 44. In an embodiment, the light-absorbing layer 46 may have a top surface 45 that is coplanar or substantially coplanar with the top surface 11, 29, 31. In an embodiment, the top surface 45 of the light-absorbing layer 46 may be coplanar or substantially coplanar with the top surfaces 13, 29, 31. In an embodiment, the top surface 45 of the light-absorbing layer 46 may be coplanar or substantially coplanar with the top surfaces 11, 13, 29, 31. The light-absorbing layer 46 may be located fully at and below the top surface 11 and/or the top surface 13.

In an embodiment, the light-absorbing layer 46 may contain a material comprising germanium, and the light-absorbing layers 28, 30 may contain a different material comprising germanium. In an embodiment, the material of the light-absorbing layer 46 may be germanium-tin, and the material of the light-absorbing layer 28 and the material of the light-absorbing layer 30 may be germanium.

Processing may continue as described in connection with FIG. 5. In particular, the layer 32 may also be formed over the light-absorbing layer 46. In an embodiment, the layer 32 may be in direct physical and electrical contact with the light-absorbing layer 46, as well as with the light-absorbing layers 28, 30.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A structure comprising:
a substrate including a first trench extending to a first depth into the substrate and a second trench extending to a second depth into the substrate that is greater than the first depth;
a well in the substrate;
a first photodiode including a first light-absorbing layer comprising a first material positioned in the first trench, the first light-absorbing layer having a first conductivity type; and
a second photodiode including a second light-absorbing layer comprising a second material positioned in the second trench, the second light-absorbing layer having the first conductivity type,
wherein the well has a second conductivity type opposite to the first conductivity type, the first trench and the second trench extend into the well, and the first material and the second material each comprise germanium.

2. The structure of claim 1 wherein the first material differs in composition from the second material.

3. The structure of claim 1 wherein the first material has the same composition as the second material.

4. The structure of claim 1 wherein the first material is germanium, and the second material is a germanium-tin alloy.

5. The structure of claim 1 wherein the first material is germanium, and the second material is germanium.

6. The structure of claim 1 wherein the substrate comprises single-crystal silicon, and further comprising:
a third photodiode including a third light-absorbing layer comprising a doped region in the substrate.

7. The structure of claim 6 wherein the first light-absorbing layer has a top surface, and the second light-absorbing layer has a top surface that is substantially coplanar with the top surface of the first light-absorbing layer, and the third light-absorbing layer has a top surface that is substantially coplanar with the top surface of the first light-absorbing layer.

8. The structure of claim 1 wherein the first light-absorbing layer has a top surface, and the second light-absorbing layer has a top surface that is substantially coplanar with the top surface of the first light-absorbing layer.

9. The structure of claim 1 wherein the substrate has a top surface, the first light-absorbing layer has a top surface that is substantially coplanar with the top surface of the substrate, and the second light-absorbing layer has a top surface that is substantially coplanar with the top surface of the substrate.

10. The structure of claim 1 further comprising:
a plurality of trench isolation regions arranged in the substrate to surround the first trench and the second trench.

11. A structure comprising:
a substrate including a first trench extending to a first depth into the substrate, a second trench extending to a second depth into the substrate that is greater than the first depth, and a third trench extending to a third depth;
a first photodiode including a first light-absorbing layer comprising a first material positioned in the first trench;
a second photodiode including a second light-absorbing layer comprising a second material positioned in the second trench; and
a third photodiode including a third light-absorbing layer comprising a third material positioned in the third trench,
wherein the first material, the second material, and the third material each comprise germanium, the first material and the second material are germanium, and the third material is a germanium-tin alloy.

12. The structure of claim 11 wherein the third depth is substantially equal to the second depth.

13. The structure of claim 11 wherein the first light-absorbing layer and the second light-absorbing layer have a first conductivity type, and further comprising:
a well in the substrate, the well having a second conductivity type opposite to the first conductivity type,
wherein the first trench and the second trench extend into the well.

14. A method comprising:
forming a well in a substrate;
forming a first trench extending to a first depth into the substrate and a second trench extending to a second depth into the substrate that is greater than the first depth;
forming a first photodiode including a first light-absorbing layer comprising a first material positioned in the first trench; and
forming a second photodiode including a second light-absorbing layer comprising a second material positioned in the second trench,
wherein the first light-absorbing layer and the second light-absorbing layer have a first conductivity type, the well has a second conductivity type opposite to the first conductivity type, the first trench and the second trench extend into the well, and the first material and the second material each comprise germanium.

15. The method of claim 14 wherein the first light-absorbing layer has a top surface, and the second light-absorbing layer has a top surface that is substantially coplanar with the top surface of the first light-absorbing layer.

16. The method of claim 14 wherein the substrate has a top surface, the first light-absorbing layer has a top surface that is substantially coplanar with the top surface of the substrate, and the second light-absorbing layer has a top surface that is substantially coplanar with the top surface of the substrate.

17. The method of claim 14 wherein the first material is germanium, and the second material is a germanium-tin alloy.

18. The method of claim 14 wherein the substrate comprises single-crystal silicon, and further comprising:
forming a third photodiode including a third light-absorbing layer comprising a doped region in the substrate.

19. The method of claim 14 wherein the substrate includes a third trench extending to a third depth, and further comprising:
forming a third photodiode including a third light-absorbing layer comprising a third material positioned in the third trench,
wherein the first material and the second material are germanium, and the third material is a germanium-tin alloy.

20. The method of claim 19 wherein the third depth is substantially equal to the second depth.

* * * * *